(12) United States Patent
Xu

(10) Patent No.: US 10,511,321 B2
(45) Date of Patent: Dec. 17, 2019

(54) DIGITAL-TO-ANALOG CONVERTER AND METHOD FOR DIGITAL-TO-ANALOG CONVERSION

(71) Applicant: ams AG, Premstaetten (AT)

(72) Inventor: Gonggui Xu, Plano, TX (US)

(73) Assignee: ams AG, Premstaetten (AT)

( * ) Notice: Subject to any disclaimer, the term of this patent is extended or adjusted under 35 U.S.C. 154(b) by 0 days.

(21) Appl. No.: 16/079,546

(22) PCT Filed: Feb. 23, 2017

(86) PCT No.: PCT/EP2017/054223
§ 371 (c)(1),
(2) Date: Aug. 23, 2018

(87) PCT Pub. No.: WO2017/144605
PCT Pub. Date: Aug. 31, 2017

(65) Prior Publication Data
US 2019/0058487 A1    Feb. 21, 2019

Related U.S. Application Data

(60) Provisional application No. 62/299,648, filed on Feb. 25, 2016.

(30) Foreign Application Priority Data

Apr. 6, 2016 (EP) ..................... 16164077

(51) Int. Cl.
H03M 1/68 (2006.01)
H03M 1/74 (2006.01)
G05F 3/16 (2006.01)

(52) U.S. Cl.
CPC ............... *H03M 1/68* (2013.01); *G05F 3/16* (2013.01); *H03M 1/687* (2013.01); *H03M 1/682* (2013.01); *H03M 1/747* (2013.01)

(58) Field of Classification Search
CPC ..................................... H03M 1/687
See application file for complete search history.

(56) References Cited

U.S. PATENT DOCUMENTS

| 4,292,625 A * | 9/1981 | Schoeff ............. H03M 1/74 341/145 |
| 5,841,384 A * | 11/1998 | Herman ............. H03M 1/664 341/138 |
| 7,026,971 B2 * | 4/2006 | Horsky ............. H03M 1/682 341/145 |

FOREIGN PATENT DOCUMENTS

EP    1465347 A1    10/2004

OTHER PUBLICATIONS

Horsky, P. "A monotonic precise current DAC for sensor applications" Radioengineering, vol. 17, No. 4—Dec. 2008.

* cited by examiner

*Primary Examiner* — Howard Williams
(74) *Attorney, Agent, or Firm* — Fish & Richardson

(57) ABSTRACT

A digital-to-analog converter comprises a converter output (11), a dummy output (12), a first number N of current sources (13-17), a first switching arrangement (18), a first current divider (24), a second switching arrangement (31) and a second current divider (60). The current sources (13-17) are coupled via the first switching arrangement (18) to the converter output (11), the dummy output (12) or to an input current terminal (25) of the first current divider (24). The output current terminals (26-30) of the first current divider (24) are coupled via the second switching arrangement (31) to the converter output (11), the dummy output (12) or to an input current terminal (61) of the second current divider (60). The output current terminals (63-66) of the second current divider (60) are coupled to the converter output (11) or the dummy output (12).

15 Claims, 5 Drawing Sheets

FIG 2
| Parameters | Figure 1B | Figure 1D |
|---|---|---|
| Overall Resolution | 10 bits | 10 bits |
| Segmentation | 5 bits-5 bits | 4 bits - 3 bits - 3 bits |
| Coding | Coarse thermometer; fine binary | All thermometer |
| Area | 120 μm·150μm | 100 μm·150μm |
| DNL | [-1.01, 1.01] | [-0.26, 0.26] |
| Current (μA) | 2.02 | 1.03 |
FIG 3A
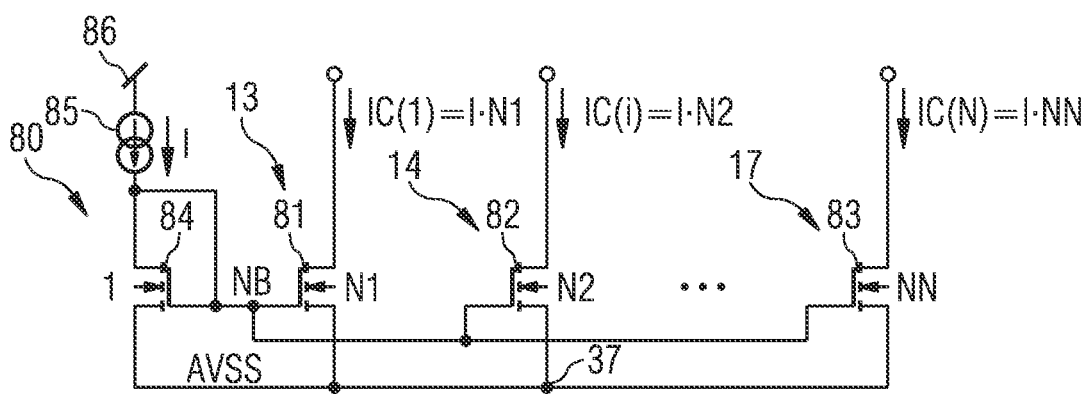
FIG 3B
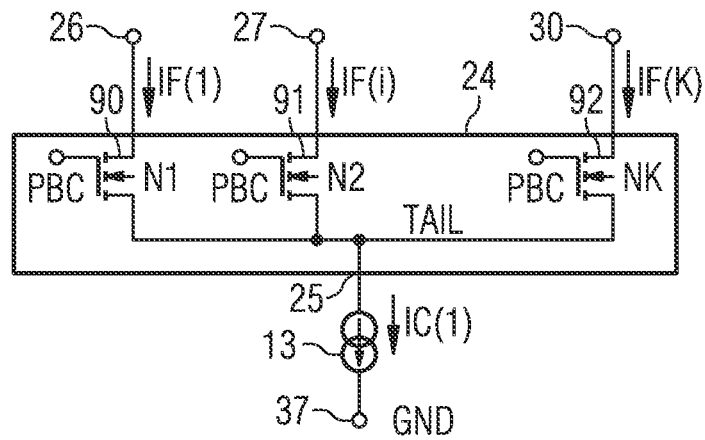

DIGITAL-TO-ANALOG CONVERTER AND METHOD FOR DIGITAL-TO-ANALOG CONVERSION

BACKGROUND OF THE INVENTION

The present disclosure is related to a digital-to-analog converter and a method for digital-to-analog conversion.

A digital-to-analog converter converts a digital input signal into an analog output signal. A digital-to-analog converter realized as a thermometer-coded converter achieves a high accuracy and a high speed, but results in high cost due to the area of silicon on the substrate required for fabrication of the parallel branches of the thermometer-coded converter.

SUMMARY OF THE INVENTION

In an embodiment, a digital-to-analog converter comprises a converter output, a dummy output, a first number N of current sources, a first switching arrangement, a first current divider with an input current terminal and a second number K of output current terminals, a second switching arrangement, and a second current divider with an input current terminal and a third number P of output current terminals. Each of the first number N of current sources is coupled via the first switching arrangement either to the converter output, the dummy output or to the input current terminal of the first current divider. Each of the second number K of output current terminals of the first current divider is coupled via the second switching arrangement either to the converter output, the dummy output or to the input current terminal of the second current divider. Each of the third number P of output current terminals of the second current divider is coupled to the converter output and/or the dummy output.

Advantageously, a high accuracy of digital-to-analog conversion can be achieved by using a stack of two current dividers. The number of circuit parts is reduced resulting in cost savings.

In an embodiment, the digital-to-analog converter comprises at least one further current divider and at least one further switching arrangement. Each of the second number K of output current terminals of the first current divider is coupled via the second switching arrangement either to the converter output, the dummy output or via the at least one further current divider and the at least one further switching arrangement to the input current terminal of the second current divider. Advantageously, the number of current sources can be kept low by adding at least one further current divider and at least one further switching arrangement.

In an embodiment, each current source is selectively coupled via the first switching arrangement to one of the converter output, the dummy output and the input current terminal of the first current divider. The selective coupling is set depending on a first control signal.

In an embodiment, one output current terminal of the first current divider is selectively coupled via the second switching arrangement to the converter output or to the input current terminal of the second current divider, depending on a second control signal. Another output current terminal of the first current divider may be selectively coupled via the second switching arrangement to the dummy output or to the input current terminal of the second current divider, depending on the second control signal. In case the second number K is higher than 2, then a further output current terminal of the first current divider may be selectively coupled via the second switching arrangement to the converter output, the dummy output or the input current terminal of the second current divider, depending on the second control signal.

In an embodiment, one output current terminal of the second current divider may be directly connected to the converter output. Another output current terminal of the second current divider may be directly connected to the dummy output. Said direct connection may be permanent. Said direct connection may comprise a transistor, permanently set in a conducting state.

In an embodiment, an output current terminal of the second current divider is selectively coupled by a third switching arrangement to the converter output or the dummy output.

In an embodiment, an output current terminal of the second current divider is selectively coupled by at least a further switching arrangement and, optionally, by at least a further current divider to the converter output and/or the dummy output.

In an embodiment, each of the third number P of output current terminals of the second current divider is coupled to the converter output or the dummy output by a number M of further switching arrangements and a number (M−1) of further current divider, wherein the number M larger than 0.

In an embodiment, the first number N of current sources are realized as a current mirror.

In an embodiment, the first number N of current sources are thermometer-coded or binary-coded.

In an embodiment, the first current divider is thermometer-coded or binary-coded.

In an embodiment, the second current divider is thermometer-coded or binary-coded.

In an embodiment, the first current divider comprises a second number K of divider transistors. The input current terminal of the first current divider is coupled to first terminals of the second number K of divider transistors. The second number K of output current terminals of the first current divider are coupled to second terminals of the second number K of divider transistors. The number of the divider transistors of the first current divider may be equal to the number of output current terminals of the first current divider. A divider transistor can be called transistor, cascode transistor or current divider's transistor. A divider transistor is a transistor comprised by a current divider.

In an embodiment, the second number K of divider transistors have at least two different current driving capabilities.

In an embodiment, the second number K of divider transistors have at least two different areas or at least two different width-to-length ratio.

In an embodiment, the second number K of divider transistors have an equal current driving capability.

In an embodiment, the digital-to-analog converter is configured such that an output current flowing through the converter output is proportional to a digital input signal provided to the digital-to-analog converter.

In an embodiment, the first number N of current sources is at least two, the second number K of output current terminals is at least two and the third number P of output current terminals is at least two.

In an embodiment, at least one of the first number N of current sources, the second number K of output current terminals and the third number P of output current terminals is exactly two.

In an embodiment, the first number N of current sources, the second number K of output current terminals and the third number P of output current terminals is exactly two.

In an embodiment, a digital-to-analog converter comprises a converter output and a cascade structure that is coupled to the converter output and comprises a number L of segmentation levels. A first segmentation level of the number L of segmentation levels comprises a first number N of current sources and a first switching arrangement. At least a second segmentation level of the number L of segmentation levels comprises a current divider. This current divider may be a first current divider.

Optionally, the at least one second segmentation level further comprises a switching arrangement.

The cascade structure may consist of the number L of segmentation levels.

The number L may be at least 2 or may be at least 3.

In an embodiment, the second segmentation level comprises a first current divider with an input current terminal and a second number K of output current terminals. The number L is at least 2, the first number N is 2 and the second number K is 2.

In an embodiment, a digital-to-analog converter comprises a converter output and a cascade structure that is coupled to the converter output and comprises a number L of segmentation levels. A first segmentation level of the number L of segmentation levels comprises a first number N of current sources and a first switching arrangement. A second segmentation level of the number L of segmentation levels comprises a first current divider with an input current terminal and a second number K of output current terminals and a second switching arrangement. A third segmentation level of the number L of segmentation levels comprises a second current divider and a third switching arrangement.

In an embodiment, the first number N of current sources is exactly 2. The second number K of output current terminals of the first current divider may be exactly 2. A third number P of output current terminals of the second current divider may be exactly 2.

Advantageously, the number of current sources is reduced to a minimum. One segmentation level is arranged on top of the other from a voltage terminal up to the converter output. Thus, a high resolution of the converter can be achieved.

In an embodiment, a method for digital-to-analog conversion comprises flowing a first source current through a current source of a first number N of current sources, wherein at least a portion of the first source current flows through at least a first and a second current divider to a converter output.

The first source current is the current that flows through the first current source. The second source current is the current that flows through the second current source.

In an embodiment, according to a method for digital-to-analog conversion at least a portion of a first source current that flows through a first current source of a first number N of current sources flows to a converter output. Each of the first number N of current sources is coupled via a first switching arrangement either to the converter output, a dummy output or to an input current terminal of a first current divider. Each of a second number K of output current terminals of the first current divider is coupled via a second switching arrangement either to the converter output, the dummy output or to an input current terminal of a second current divider. Each of a third number P of output current terminals of the second current divider is coupled to at least one of the converter output and the dummy output.

In an embodiment, an output current flowing through the converter output is proportional to a digital input signal provided to the digital-to-analog converter.

Thus, the digital-to-analog converter converts a digital input signal in an analog output signal in the form of the output current.

In an embodiment, in case one current source of the first number of current sources is coupled to the first current divider and the digital input signal increases, the changeover switches of the second and—if available also the third—switching arrangement are set such that the output current increases. If the output current cannot be increased by a change of the positions of the changeover switches of the second and—if available also the third—switching arrangement, then—in case the digital input signal increases—said current source is coupled to the converter output by the first switching arrangement and another current source of the first number of current sources is coupled to the first current divider.

BRIEF DESCRIPTION OF THE DRAWINGS

The following description of figures of exemplary embodiments may further illustrate and explain aspects of the invention. Devices and circuit blocks with the same structure and the same effect, respectively, appear with equivalent reference symbols. In so far as devices or circuit blocks correspond to one another in terms of their function in different figures, the description thereof is not repeated for each of the following figures.

FIG. 2 shows an example of parameters of two embodiments of a digital-to-analog converter.

FIGS. 3A and 3B show exemplary embodiments of details of a digital-to-analog converter.

DETAILED DESCRIPTION

Figure 1A:
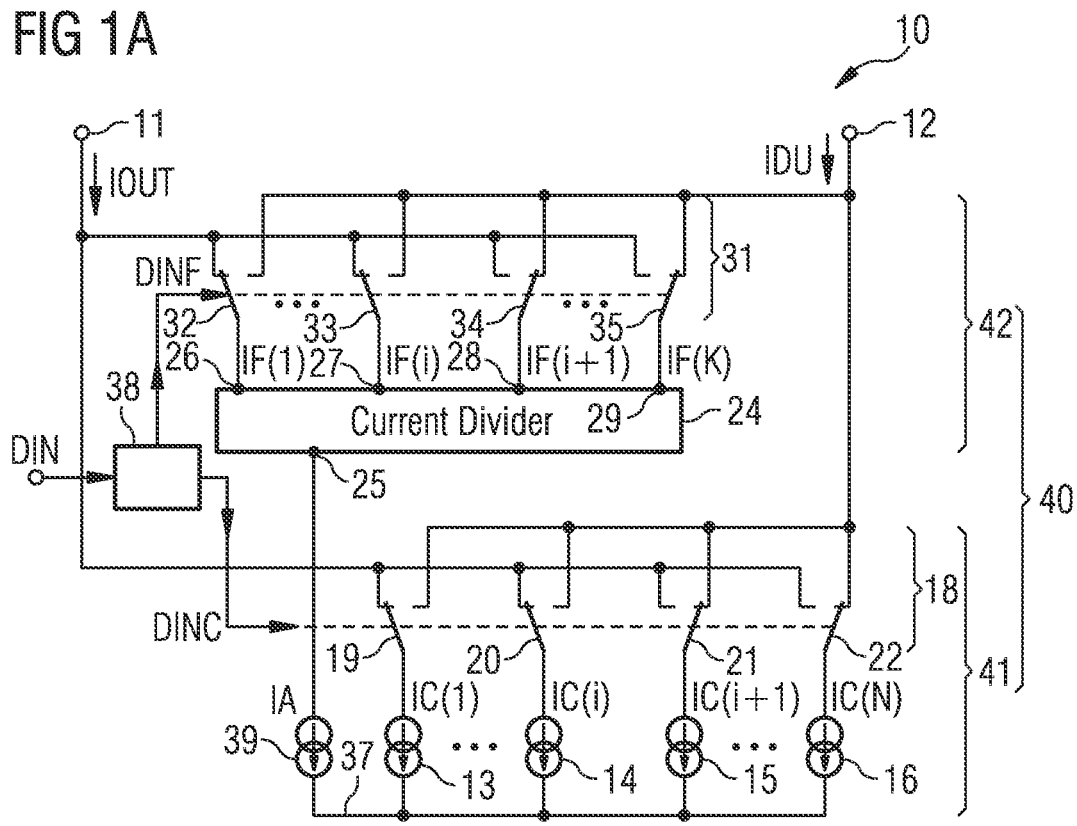
FIGS. 1A to 1D show exemplary embodiments of a digital-to-analog converter.

FIG. 1A shows an exemplary embodiment of a digital-to-analog converter 10, abbreviated as DA converter. The DA converter 10 comprises a converter output 11, a dummy output 12 and a first number N of current sources 13 to 16. The first number N is at least 2. In the example shown in FIG. 1A, the first number N is four. Each current source 13 to 16 of the first number N of current sources has a first terminal connected to a voltage terminal 37. The voltage terminal 37 may be realized as a reference potential terminal. A second terminal of the current sources 13 to 16 of the first number N of current sources is connected via a first switching arrangement 18 either to the converter output 11 or to the dummy output 12. Each current source 13 to 16 of the first number N of current sources may be implemented as a current sink.

The first switching arrangement 18 comprises the first number N of changeover switches 19 to 22. A first current source 13 of the first number N of current sources is connected via its second terminal and a first changeover switch 19 of the first switching arrangement 18 either to the converter output 11 or to the dummy output 12. Correspondingly, the further current sources 14 to 16 of the first number N of current sources are similarly connected via a second, a third and a fourth changeover switch 20 to 22 to the converter output 11 and the dummy output 12.

The changeover switches 19 to 22 of the first switching arrangement 18 have an input connected to one current source out of the first number N of current sources 13 to 16 and have a first output connected to the converter output 11 and a second output connected to the dummy output 12.

Moreover, the DA converter 10 may comprise an additional current source 39. A first terminal of the additional current source 39 is connected to the voltage terminal 37.

The DA converter 10 comprises a first current divider 24. The first current divider 24 has one input current terminal 25 and a second number K of output current terminals 26 to 29. The second number K is at least 2. In the example shown in FIG. 1A, the second number K is 4. A second terminal of the additional current source 39 is connected to the input current terminal 25 of the first current divider 24. Thus, the additional current source 39 is coupled via the first current divider 24 to the converter output 11 and to the dummy output 12.

The DA converter 10 may comprise a second switching arrangement 31. The second switching arrangement 31 is arranged between the first current divider 24 and the converter output 11 and the dummy output 12. The second switching arrangement 31 comprises a second number K of changeover switches 32 to 35. An input terminal of a first changeover switch 32 of the second number K of changeover switches 32 to 36 is connected to a first output current terminal 26 of the first current divider 24. The first changeover switch 32 has a first output connected to the converter output 11 and a second output connected to the dummy output 12.

The DA converter 10 comprises a control circuit 38 that is connected on its output side to the control terminals of the changeover switches 19 to 22, 32 to 35 of the first and the second switching arrangement 18, 31.

An output current IOUT flows through the converter output 11. Correspondingly, a dummy current IDU flows through the dummy output 12. The output current IOUT flows from the converter output 11 to the voltage terminal 37. Correspondingly, the dummy current IDU flows from the dummy output 12 to the voltage terminal 37. A first control signal DINC is provided to the first switching arrangement 18 and thus to the control terminals of the first number N of the changeover switches 19 to 22. Correspondingly, a second control signal DINF is provided to the second switching arrangement 31 and thus to the control terminals of the changeover switches 32 to 36 of the second number K of changeover switches.

The first number N of source currents IC(1), IC(i), IC(i+1), IC(N) flows through the first number N of current sources 13 to 16. The first source current IC(1) provided by the first current source 13 either flows through the converter output 11 or through the dummy output 12 depending on the first control signal DINC. Correspondingly, the source currents of the further current sources 14 to 16 either flow through the converter output 11 or through the dummy output 12 depending on the first control signal DINC controlling the first switching arrangement 18.

The additional current source 39 provides an additional source current IA that flows through the first current divider 24. The additional source current IA partially flows either through the converter output 11 or through the dummy output 12 depending the second control signal DINF. If each of the inputs of the second number K of changeover switches 32 to 35 are connected to the first output of the second number K of changeover switches and thus to the converter output 11, then the additional source current IA completely flows through the converter output 11. If, contrary to that, the inputs of the first number N of changeover switches 32 to 35 are connected to the second output of the second number K of changeover switches, the additional source current IA completely flows through the dummy output 12. If some of the changeover switches are set by the second control signal DINF such that the input terminal of the respective changeover switch 32, 33 is connected to the first output of the changeover switches and the other changeover switches 34, 35 of the second number K of changeover switches are set such that the input terminal is connected to the second output of the changeover switches 34, 35, then the additional source current IA partially flows through the converter output 11 and partially flows through the dummy output 12.

The first and the second control signal DINC, DINF control the height of the output current IOUT. A digital input signal DIN is provided to the control circuit 38. The control circuit 38 converts the digital input signal DIN into the first and the second control signal DINC, DINF. The sum of the output current IOUT and of the dummy current IDU is constant and is independent of the digital input signal DIN.

The DA converter 10 has a cascade structure 40. The cascade structure 40 comprises the number L of segmentation levels. In the example shown in FIG. 1A, the number L is 2. A first segmentation level 41 of the number L of segmentation levels comprises the first number N of current sources 13 to 16, the additional current source 39 and the first switching arrangement 18. The second segmentation level 42 of the number L of segmentation levels comprises the first current divider 24 and the second switching arrangement 31. The converter output 11 is coupled via the second segmentation level 42 to the first segmentation level 41. Correspondingly, the dummy output 12 is coupled via the second segmentation level 42 to the first segmentation level 41.

In FIG. 1A, a segmented current-steering DA converter architecture is illustrated. The digital input signal DIN is grouped into two segments: the first control signal DINC which can be called DIN(coarse) and the second control signal DINF that can be named DIN(fine). DIN(coarse) are the most significant bits, abbreviated MSBs. DIN(fine) are the least significant bits, abbreviated LSBs. DIN(coarse) selectively controls the coarse current branches. In FIG. 1A, the source currents IC(1), . . . , IC(i) go to the converter output 11 and thus contribute to the analog output current IOUT. The source currents IC(i+1), . . . , IC(N) are not used and are collected as dummy current IDU. A dedicated unit coarse source current IA is used to generate fine currents through the first current divider 24. Specifically, the second control signal DINF selectively controls the fine divider current IF(1), . . . , IF(i) to the converter output 11. The divider currents IF(i+1), . . . , IF(K) are not used and collected into the dummy output current IDU. Advantageously, this architecture is simple.

In this architecture there may be mismatches between the additional source current IA and the other source currents IC(1) to IC(N). If the mismatch between them is more than the fine current level, then a non-monotonic behavior is generated. Assuming that the coarse segment is thermometer-coded, the fine segment is binary weighted, the fine unit current variance is $\sigma_u$ and the number of bits for fine segment is Bb, then the variance of the differential non-linearity (abbreviated DNL) for the DA converter 10 is:

$$\sigma_{DNL} = \sigma_u * \sqrt{2^{Bb+1}-1}$$

In an alternative, non-shown embodiment, the voltage terminal 37 is realized as a supply voltage terminal. A supply voltage can be applied to the supply voltage terminal.

In an alternative embodiment, not shown, the first number N is different from 4. The first number N may be, for example, 2, 3 or larger than 4.

In an alternative embodiment, not shown, the second number K is different from 4. The second number K may be, for example, 2, 3 or larger than 4.

Figure 1B:
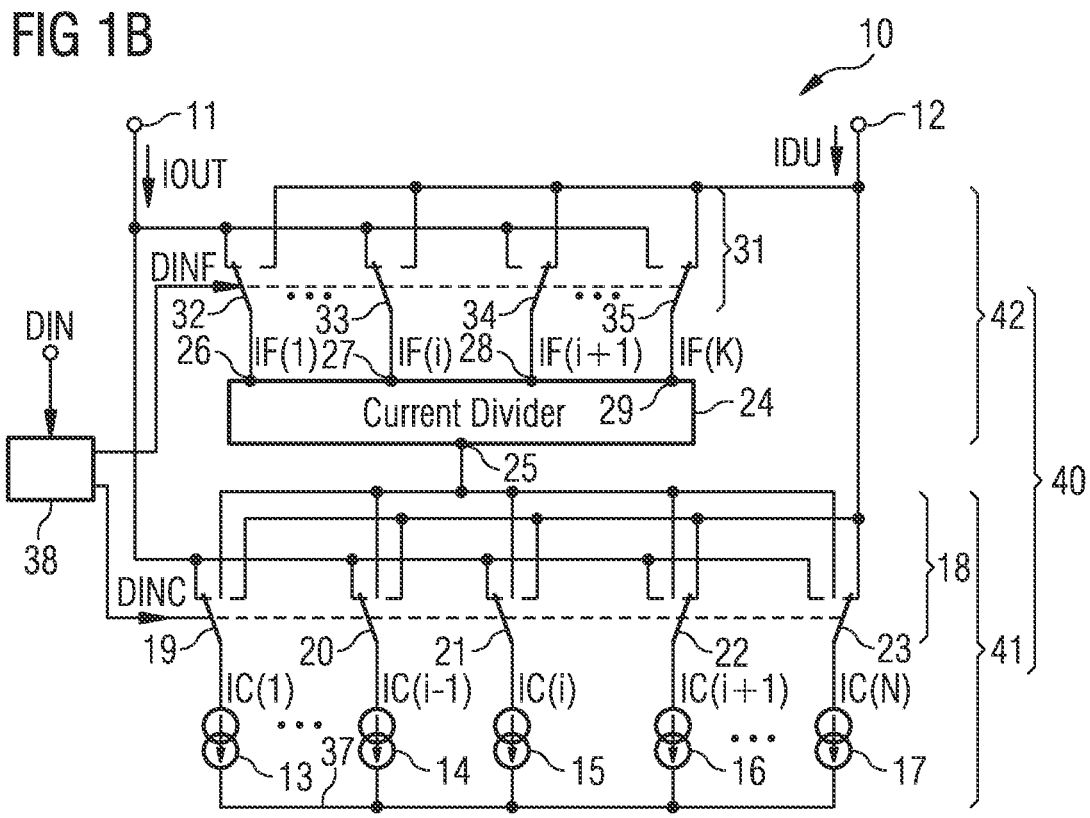

FIG. 1B shows a further exemplary embodiment of the DA converter 10 which is a further development of the embodiment shown in FIG. 1A. The additional current source 39 shown in FIG. 1A is omitted in the DA converter 10 shown in FIG. 1B. Thus, the DA converter 10 is free from a current source that is directly connected to the first current divider 24 and is not coupled via the first switching arrangement 18 to the first current divider 24. The first segmentation level 41 of the number L of segmentation levels comprises the first number N of current sources 13 to 17 and the first switching arrangement 18.

The DA 10 comprises the first number N of current sources 13 to 17. The first number N is at least 2. In the example shown in FIG. 1B, the first number N is 5. The first switching arrangement 18 comprises the first number N of changeover switches 19 to 23. Each of the first number N of changeover switches 19 to 23 have an input terminal connected to one of the current sources 13 to 17 of the first number N of current sources. Moreover, the first changeover switch 19 of the first switching arrangement 18 has three output terminals: a first output of the first changeover switch 19 is connected to the converter output 11, a second output of the first changeover switch 19 is connected to the dummy output 12 and a third output of the first changeover switch 19 is connected to the input current terminal 25 of the first current divider 24. The first current divider 24 and the second switching arrangement 31 may be realized such as shown in FIG. 1A.

The first source current IC(1) of the first current source 13 either flows directly to the converter output 11 or flows directly to the dummy output 12 or flows to the input current terminal 25 of the first current divider 24 via the first changeover switch 19, depending on the first control signal DINC. In the latter case, the first source current IC(1) flows to the converter output 11 and/or to the dummy output 12, depending on the second control signal DINF.

The first control signal DINC is realized such that each of the changeover switches 19 to 23 can be set either in the first or the second or the third position. The maximum of one of the current sources 19 to 23 of the first number N of current sources is connected via the first switching arrangement 18 to the first current divider 24.

The same value of the output current IOUT can be achieved either by connecting one of the current sources, for example the first current source 13 directly to the converter output 11 or by connecting the first current source 13 to the input current terminal 25 of the first current divider 24 and connecting each of the second number K of output current terminals 26 to 30 via the second switching arrangement 31 to the converter output 11. Correspondingly, another value of the output current IOUT can be provided by connecting, for example, the first current source 13 directly to the dummy output 12 or by connecting the first current source 13 via the first current divider 24 and each of the second number K of changeover switches of the second switching arrangement 31 to the dummy output 12.

In the DA converter 10 shown in FIG. 1B, a dynamic next-to-be-fully-selected coarse source current is used for fine current generation, instead of generating fine currents from a fixed coarse source current IA provided by the additional current source 39 as shown in FIG. 1A. The benefits of this change is a linearity improvement which is explained next.

In the example shown in FIG. 1B, the source currents IC(1) through IC(i−1) are selected by the first control signal DINC as output current IOUT; the source currents IC(i+1) through IC(N) are not used and are grouped together into the dummy current IDU; the source current IC(i) is the coarse current branch which is sub-divided into fine currents and is next-to-be-fully-switched to the output current IOUT. Since the source current IC(i) is the next-to-be-fully-selected coarse source current, it will be smoother to be sub-divided into fine currents.

When the first control signal DINC is incremented by one, all of the sub-divide fine currents from IC(i) will be fully used and the source current IC(i+1) will be chosen to be sub-divided. Any mismatch between the source currents IC(i) and IC(i+1) will be localized to the fine unit current variance. Therefore, the overall coarse source current variance will not contribute to DNL. The maximum DNL mainly comes from fine current segment itself. Assuming that the coarse segment is thermometer-coded, the fine segment is binary weighted, the fine unit current variance is $\sigma_u$ and the number of bits for fine segment is Bb, then the differential non-linearity (DNL) of the DA converter 10 is:

$$\sigma_{DNL} = \sigma_u * \sqrt{2^{Bb} - 1}$$

Essentially, the DNL is cut by half compared to the previous architecture in FIG. 1A.

In an alternative embodiment, not shown, the first number N is different from 5. The first number N may be, for example, 2, 3, 4 or larger than 5.

In an alternative embodiment, not shown, the second number K is different from 4. The second number K may be, for example, 2, 3 or larger than 4.

Figure 1C:
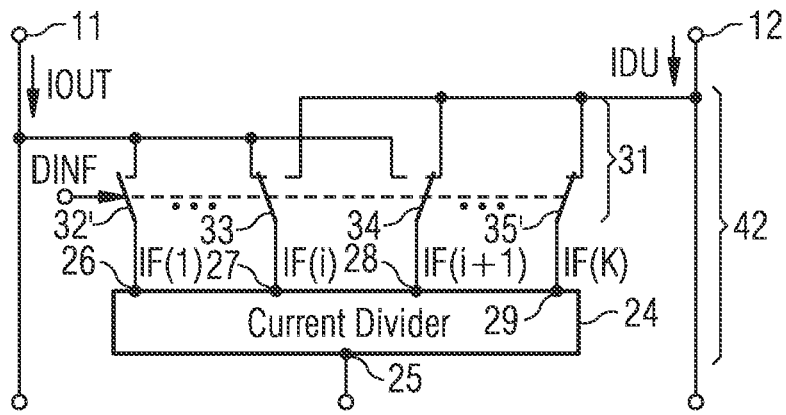

FIG. 1C shows an exemplary embodiment of the second switching arrangement 31 that can be used for the realization of the DA converter 10 shown in FIG. 1B. The first current divider 24 has the second number K of output current terminals 26 to 30. The second switching arrangement 31 is realized such that the first output current terminal 26 is permanently connected to the converter output 11. Correspondingly, the last of the second number K of output current terminals 26 to 30 is permanently connected to the dummy output 12. The second switching arrangement 31 may comprise the number K−2 of changeover switches 33, 34.

The permanent connection of the first output current terminal 26 to the converter output 11 may comprise a switch 32' that is continuously in a conducting state or may consist only of connection lines. The permanent connection of the last output current terminal 29 to the dummy output 12 may comprise a switch 35' that is continuously in a conducting state or may consist only of connection lines. Advantageously, a resistance between the first output current terminal 26 to the converter output 11 via the switch 32' is equal to a resistance between the second output current terminal 27 to the converter output 11 via the second changeover switch 32. Advantageously, the number of transistors for realization of the DA converter 10 is reduced.

Figure 1D:
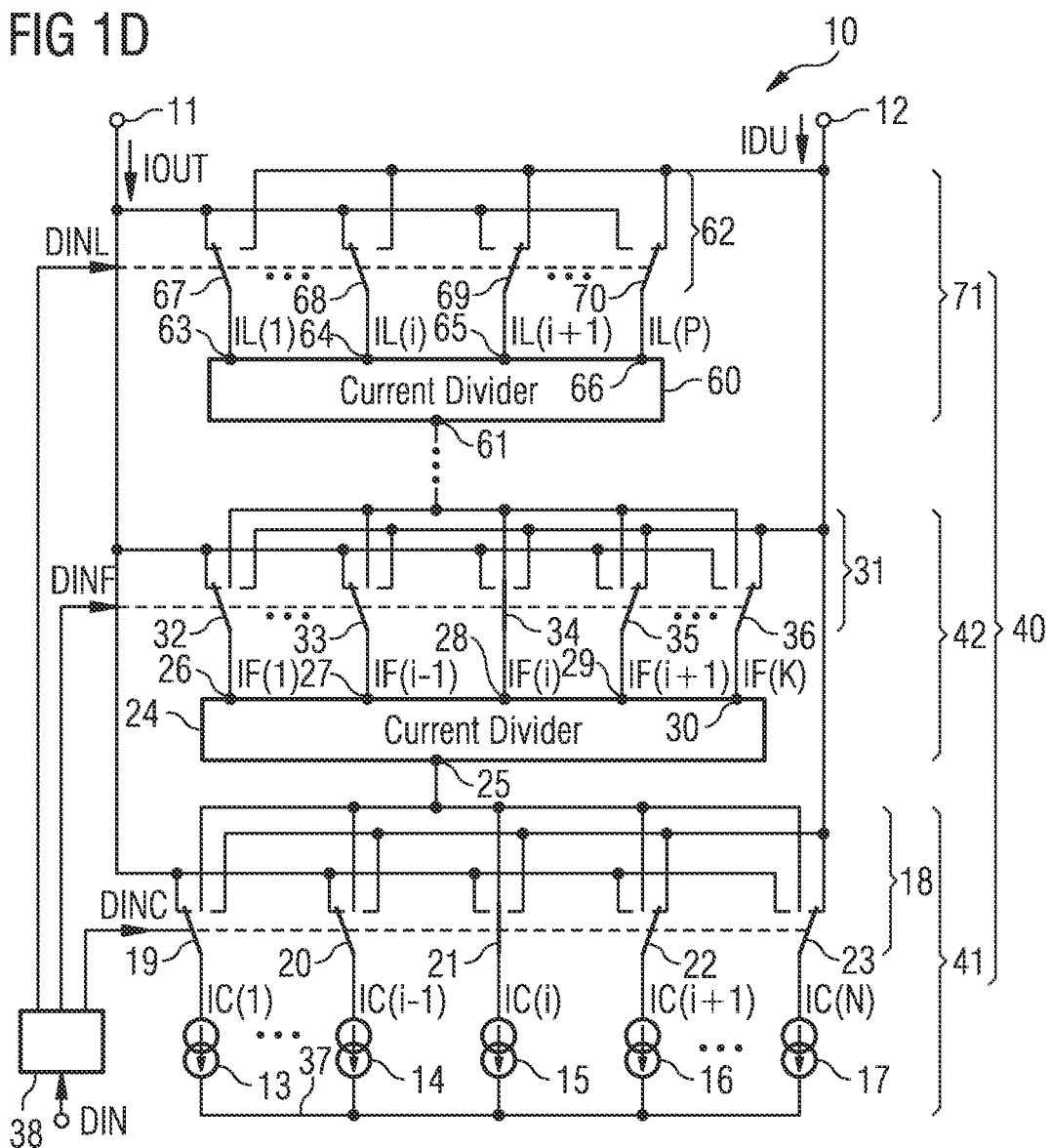

FIG. 1D shows a further exemplary embodiment of the DA converter 10 which is a further development of the embodiments shown in FIGS. 1A to 1C. The DA converter 10 comprises the first number N of current sources 13 to 17, the first switching arrangement 18, the first current divider 24 and the second switching arrangement 31. The second switching arrangement 31 is directly connected to the converter output 11 or to the dummy output 12 and is coupled via at least an second current divider 60 of the DA converter 10 to the converter output 11 and the dummy output 12. The second switching arrangement 31 may be coupled via the at least one second current divider 60 and at least one third switching arrangement 62 of the DA converter 10 to the converter output 11 and to the dummy output 12.

The cascade structure 40 comprises a third segmentation level 71. The third segmentation level 71 may comprise the second current divider 60 and the third switching arrangement 62. In the example shown in FIG. 1D, the number L of the segmentation levels is 3.

The second switching arrangement 31 is implemented such as the first switching arrangement 18 shown in FIGS. 1B and 1D. Thus, the second switching arrangement 31 comprises the second number K of changeover switches 32 to 36 that are connected to the second number K of output current terminals 26 to 30 of the first current divider 24.

At least one changeover switch of the second number K of changeover switches of the second switching arrangement 31 may comprise one input and three output terminals: The input is connected to one of the second number K of output current terminals of the first current divider 24. A first output is connected to the converter output 11, a second output is connected to the dummy output 12 and a third output is connected to an input current terminal 61 of the second current divider 60. Each of the second number K of changeover switches 32 to 36 of the second switching arrangement 31 may comprise one input terminals and three output terminals as described above.

The second current divider 60 may be implemented such as the first current divider 24. The second current divider 60 comprises the input current terminal 61 and a third number P of output current terminals 63 to 66. The third switching arrangement 62 may comprise the third number P of changeover switches 67 to 70 each having an input connected to the third number P of output current terminals 63 to 66 of the second current divider 60. The third switching arrangement 62 may be implemented such as the second switching arrangement 31 shown in FIGS. 1A, 1B and 1C. Thus, one of the third number P of changeover switches 67 to 70 comprises an input connected to one of the output current terminals 63 to 66 of the second current divider 60, a first output connected to the converter output 11 and a second output connected to the dummy output 12.

The first source current IC(1) flowing through the first current source 13 either completely flows to the converter output 11 or completely to the dummy output 12 or completely to the first current divider 24.

The current flowing through the input current terminal 25 of the first current divider 24 completely flows to the converter output 11 or completely flows to the dummy output 12 or partially flows to the converter output 11, the dummy output 12 and the input current terminal 61 of the second current divider 60.

The third switching arrangement 62 is controlled by a third control signal DINL. The current flowing through the input current terminal 61 of the second current divider 60 completely flows to the converter output 11 or completely flows to the dummy output 12 or partially flows to the converter output 11 and partially flows to the dummy output 12. Alternatively, the current flowing through the input current terminal 61 of the second current divider 60 partially flows to the converter output 11 and partially flows to the dummy output 12, for example by implementing the third switching arrangement 62 such as the second switching arrangement 31 shown in FIG. 1C.

In an alternative embodiment indicated in FIG. 1D by dots, at least one further current divider and at least one further switching arrangement are arranged between the second switching arrangement 31 and the second current divider 60. The at least one further current divider may be realized such as the first or the second current divider 24, 60. The at least one further switching arrangement may be implemented such as the first switching arrangement 18 shown in FIGS. 1B and 1D or the second switching arrangement 18 shown in FIG. 1D. Thus, the cascade structure 40 may comprise at least a further segmentation level, optionally between the second and the third segmentation level 42, 71.

The DA converter 10 implements a cascade thermometer current steering DA converter architecture. The DA converter 10 realizes a current steering architecture. The DA converter 10 converts the digital input DIN into an analog output signal in a linear way. The analog output signal is provided as the output current IOUT.

The DA converter 10 realizes a cascade thermometer current steering DA converter scheme. The influence of mismatch and non-linearity of circuit parts on the linearity of the DA conversion are reduced. The current-steering DA converter 10 minimizes the non-linearity down to a level only achieved by a fully thermometer-coded DA converter. The DNL is reduced down to least-significant unit current variance no matter how many bits are implemented. At the same time, the area of implementation of the DA converter 10 on a semiconductor body is minimized to a level only achieved by fully-binary-coded DA converter. Advantageously, the DA converter 10 can be fabricated area efficient. The DA converter 10 operates power efficient.

Compared to the single level dynamic sub-divide structure, FIG. 1D shows a cascade thermometer concept. Specifically, the digital input signal DIN is divided into L segments. L cascade levels of dynamic sub-divide structure are used to implement L segments: The first segmentation level 41 can be controlled by the most significant bits, where the first number N of thermometer-coded current branches are controlled by the first control signal DINC that can be also named DIN(SEG1): The source currents IC(1) through IC(i−1) are selected to be part of the output current IOUT; the source currents IC(i+1) through IC(N) are not used and are grouped together into the dummy current IDU; the next-to-be-fully-selected current branch IC(i) is used for sub-dividing by the first current divider 24 for the second segmentation level 42.

The second segmentation level 42 can be controlled by the second-most significant bits, where the second number K of thermometer-coded current branches are controlled by the second control signal DINF that can be named DIN(SEG2): The divider currents IF(1) through IF(i−1) are selected to be part of the output current IOUT; the divider currents IF(i+1) through IF(K) are not used and are grouped together into the dummy current IDU; the next-to-be-fully-selected divider current IF(i) is used for sub-dividing by the second current divider 60 for the third segmentation level 71.

The third or last segmentation level 71 can be controlled by the least significant bits, where the third number P of thermometer-coded current branches are controlled by the third control signal DINL that can be named DIN(SEGL): The divider currents IL(1) through IL(i) are selected to be part of the output current IOUT; the divider currents IL(i+1) through IL(P) are not used and are grouped together into the dummy current IDU.

Each of the third number P of output current terminals 63-66 of the second current divider 60 is coupled to the converter output 11 or the dummy output 12 by a number M of further switching arrangements 62, wherein the number M is 1 in the example shown in FIG. 1D.

The cascade concept essentially may turn all segmentation into different way of thermometer-coding. There are couple of observations on above described cascade thermometer concept:

1. The cascade structure 40 can be used to minimize the current branches in each cascade level. The circuit area can be significantly saved. In the best case, if each recursive level has only two equal current branches, then an area-saving can be close to a fully-binary-coding DA converter.

2. The cascade dynamic sub-dividing structure 40 make the non-linearity source localized to the currently-selected least significant unit current variance: $\sigma_{DNL}=\sigma_{u}$, therefore a thermometer-similar linearity performance is achieved.

3. The cascade structure 40 can also potentially reduce the current branches which will significantly reduce power consumption.

In an alternative embodiment, not shown, one changeover switch of the second switching arrangement 31 only has two output terminals, namely the second output that is connected to the dummy output 12 and the third output connected to the input current terminal 61 of the second current divider 60.

In an alternative embodiment, not shown, one changeover switch of the second switching arrangement 31 only has two output terminals, namely the first output that is connected to the converter output 11 and the third output connected to the input current terminal 61 of the second current divider 60.

The two alternative embodiments may also be combined. In this case, the current flowing through the input current terminal 25 of the first current divider 24 may partially flow to the converter output 11, partially flow to the dummy output 12 and/or partially flow to the input current terminal 61 of the second current divider 60 via the second switching arrangement 31. Said current does not completely flow to the converter output 11 or to the dummy output 12.

Figure 4A:
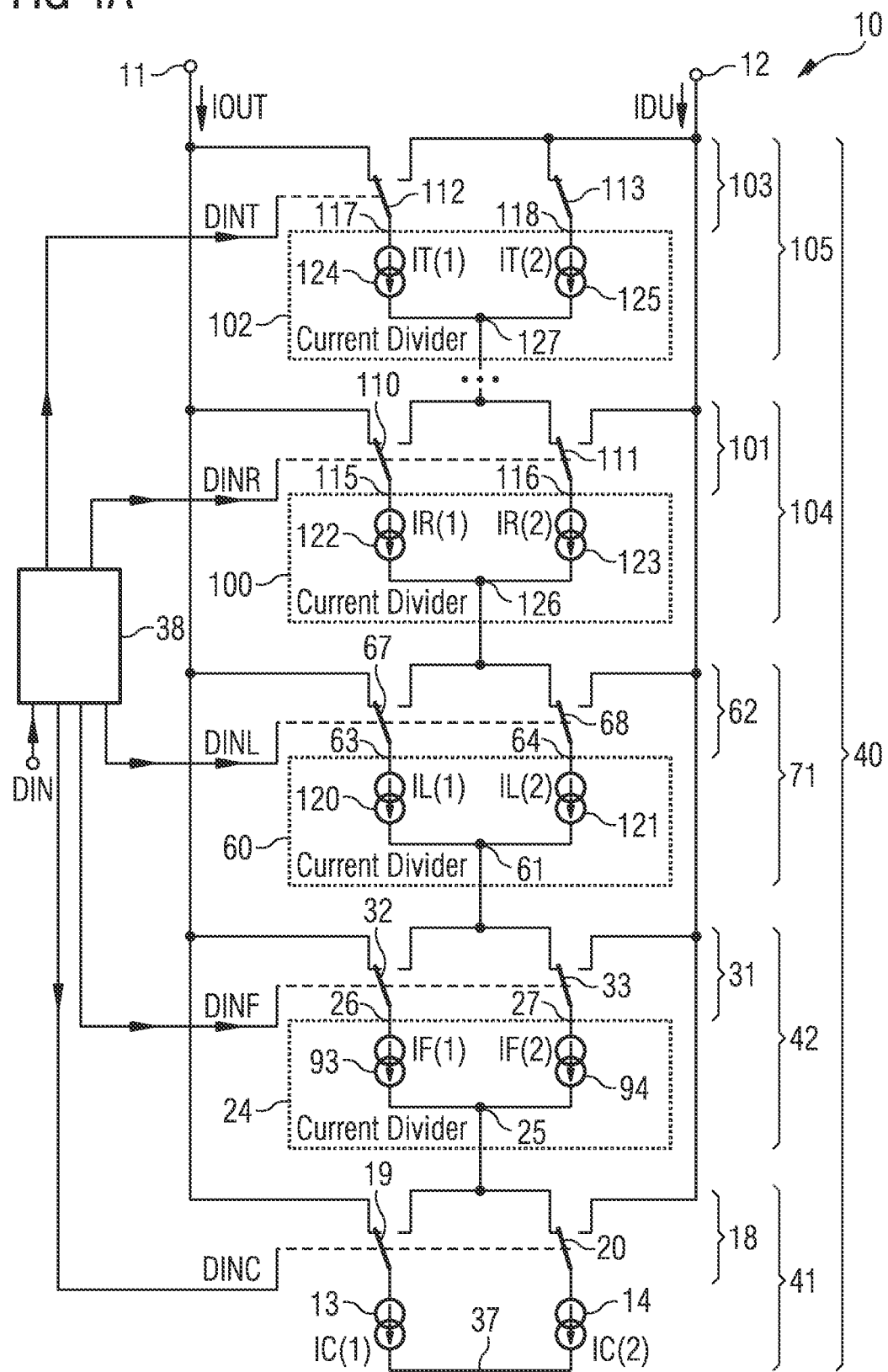
FIGS. 4A and 4B show further exemplary embodiments of a digital-to-analog converter.
Figure 4B:
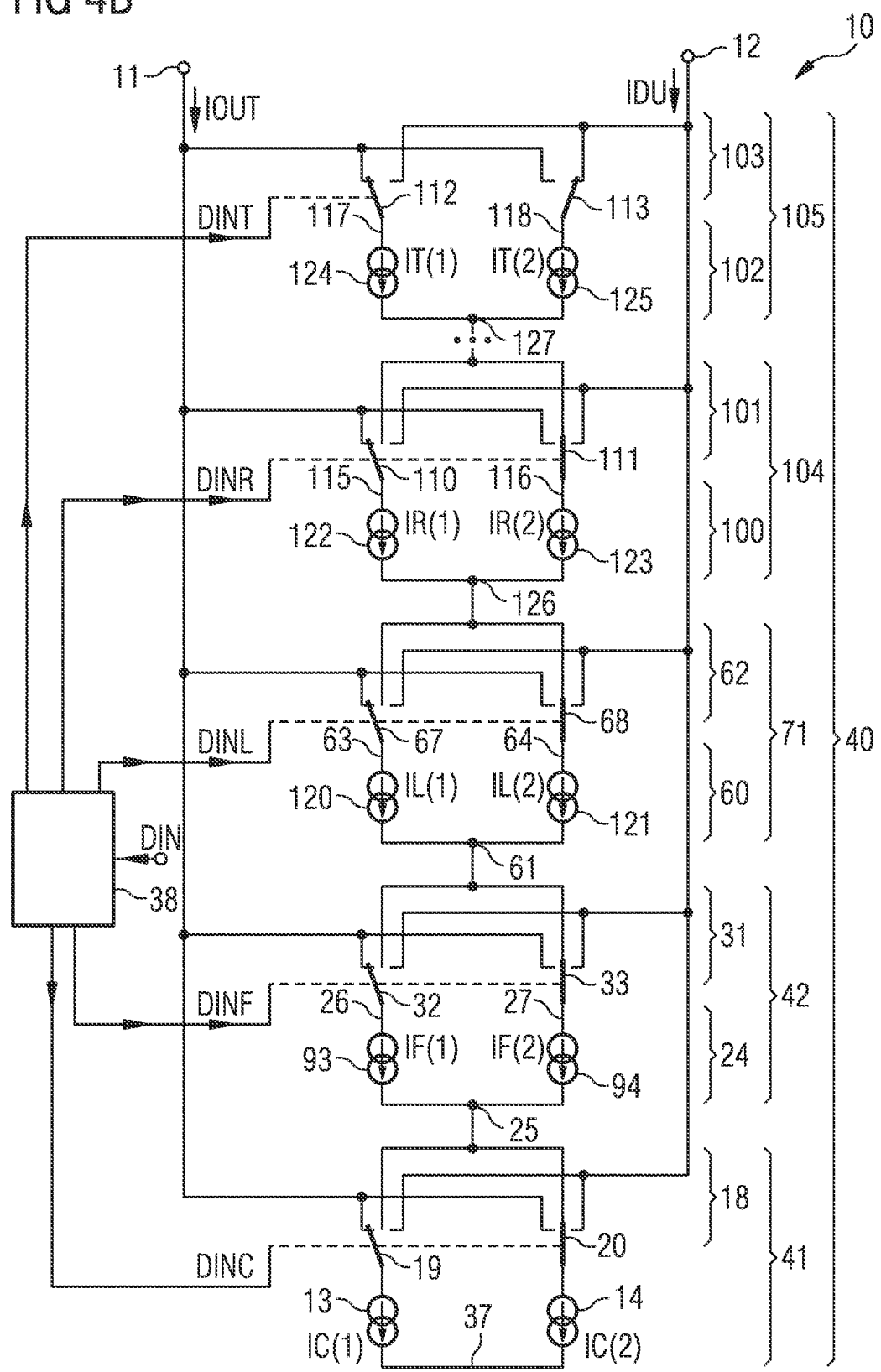

In an alternative, not shown embodiment, each of the third number P of output current terminals 63-66 of the second current divider 60 is coupled to the converter output 11 or the dummy output 12 by the number M of further switching arrangements 62 and a number (M−1) of further current dividers, wherein the number M is larger than 1. For example, the number M being 3 is illustrated by FIGS. 4A and 4B.

FIG. 2 shows an example of parameters of the DA converter 10 shown in FIG. 1B and of the DA converter 10 shown in FIG. 1D. The table shown in FIG. 2 indicates benefits of the architecture of FIG. 1D: less area, less power and better linearity performance. For the same overall resolution, the DA converter 10 realized as shown in FIG. 1D requires less area on a semiconductor body and needs a lower value of current in comparison to the DA converter 10 shown in FIG. 1B.

FIG. 3A shows an exemplary embodiment of the first number N of current sources 13 to 15 of the embodiments shown in FIGS. 1A, 1B and 1D. The first number N of current sources 13 to 15 is realized as a current mirror 80. Each current source 13 to 15 comprises a current source transistor 81 having one terminal connected to the voltage terminal 37 and a second terminal connected to the respective changeover switch of the first switching arrangement 18 that is not shown in FIG. 3A. The control terminals of each of the first number N of current source transistors 81 to 83 may be connected to each other. Moreover, the current mirror 80 comprises a current mirror transistor 84 having one terminal connected to the voltage terminal 37, a control terminal connected to the control terminals of the first number N of current source transistors 81 to 83 and a second terminal connected to the control terminal.

The current mirror transistor 84 and the current source transistors 81 to 83 are realized as field-effect transistors. Optionally, the current mirror transistor 84 and the current source transistors 81 to 83 are realized as N-channel metal-oxide-semiconductor field-effect transistors. Additionally, the current mirror 80 comprises an input current source 85 that is arranged between a supply voltage terminal 86 and the second terminal of the current mirror transistor 84.

In an example, the first number N of current sources have the same current driving capability. The first number N of source currents are equal. The first number N of current sources are thermometer coded. Thus, the first number N of current source transistors 81 to 83 has the same width-to-length ratio. The first number N of current source transistors 81 to 83 obtains the same transistor area. The current driving capability of the current source transistors 81 to 83 may be larger than the current driving capability of the current mirror transistor 84. Thus, the width-to-length ratio of the first number N of current source transistor 81 to 83 is N1-fold of the width-to-length ratio of the current mirror transistor 84.

In an alternative embodiment, at least two current sources of the first number N of current sources have a different current driving capability. For example, the first number N of current sources may be binary coded. Thus, the width-to-length ratio and/or the area of at least two of the first number N of current source transistors 81 to 83 is different.

In FIG. 3A, an example of the current sources 13 to 15 is shown. The input current source 85 provides an input current I and is used to generate the first number N of source currents through current mirrors: a first current source transistor 81 is N1 times larger of the current mirror transistor 84; therefore, the first current source transistor 81 has a source current $IC(1)=I \cdot N1$. A second current source transistor 82 is N2 larger of the current mirror transistor 84; therefore, the second current source transistor 82 has a source current $IC(i)=I \cdot N2$. The last current source transistor 83 is NN larger of the current mirror transistor 84; therefore, the last current source transistor 83 has a source current $IC(N)=I \cdot NN$.

FIG. 3B shows an exemplary embodiment of the first current divider 24 which is a further development of the first current divider 24 shown in FIGS. 1A to 1D. Also the second current divider 60 shown in FIG. 1D can be implemented such as the first current divider 24 of FIG. 3B. Also a third, a fourth or a further current divider 100, 102 as shown in FIGS. 4A and 4B may be realized such as the first current divider 24 of FIG. 3B.

The first current divider 24 shown in FIG. 3B has the second number K of output current terminals 26 to 30 and the input current terminal 25 as well as the second number K of divider transistors 90 to 92. A divider transistor can also be named transistor, cascode transistor, cascade transistor or current divider's transistor. The second number K of divider transistors 90 to 92 comprise a first terminal connected to the input current terminal 25 and a second terminal connected to the second number K of output current terminals 26 to 30. In an example, the control terminals of the second number K of divider transistors 90 to 92 may be connected to each other and thus receive the same gate voltage PBC. In an example, the current driving capability and thus the width-to-length ratio of the divider transistors 90 to 92 is identical.

The first to the third divider transistor 90 to 92 have the same value of an area. The first (or another source) current IC(1) is divided into the first number K of current outputs 26 to 30 through the first number K of divider transistors 90 to 92. The divider currents IF(1) to IF(K) provided by the first number K of divider transistor 90 to 92 are equal. The first current divider 24 is realized thermometer coded.

In an alternative embodiment, at least two of the divider transistors 90 to 92 have a different current driving capability and thus a different width-to-length ratio and/or transistor area. Since the divider transistors 90 to 92 have the same gate voltage PBC and the same source current TAIL, their drain current is mainly determined by the transistor area: the first divider transistor 90 has a drain current $IF(1)=N1 \cdot I/\Sigma N_i$ as its area is N1. The second divider transistor 91 has a drain current $IF(i)=N2 \cdot I/\Sigma N_i$ as its area is N2. The third divider transistor 92 has a drain current $IF(K)=NK \cdot I/\Sigma N_i$ as its area is NK. Thus, the first current divider 24 can be realized binary coded.

FIG. 4A shows a further exemplary embodiment of the digital-to-analog converter 10 which is a further development of the embodiments shown above. The DA converter 10 comprises a first and a second current source 13, 14. The first number N of current sources 13, 14 is exactly two. The first and the second current source 13, 14 are equal. The first and the second current source 13, 14 have the same current driving capability. Thus, the first switching arrangement 18 has a first and a second changeover switch 19, 20. The number of changeover switches 19, 20 of the first switching arrangement 18 is exactly two. The first changeover switch 19 couples the first current source 13 to the converter output 11 or to the first current divider 24. The second changeover switch 20 couples the second current source 14 to the dummy output 12 or to the first current divider 24.

The first current divider 24 has a first and a second output current terminal 26, 27. Thus, the second number K of output current terminals 26, 27 of the first current divider 24 is exactly two. The first current divider 24 has a first and a second divider current source 93, 94. The first and the second divider current source 93, 94 may be realized by two divider transistors 90, 91 as shown in FIG. 3B. The first and the second divider current source 93, 94 are equal. The first and the second divider current source 93, 94 provide a first and a second divider current IF(1), IF(2) which have the same current value. The first and the second driver current source 93, 94 have the same current driving capability. In the first current divider 24, the first divider current source 93 couples the input current terminal 25 to the first output current terminal 26. Similarly, the second divider current source 94 couples the input current terminal 25 to the second output current terminal 27.

The DA converter 10 comprises the second switching arrangement 31, the second current divider 60, the third switching arrangement 62, a third current divider 100, a fourth switching arrangement 101, a last current divider 102 and a last switching arrangement 103.

The third number P of output current terminals 63, 64 of the second current divider 60 is exactly 2. Each of the third number P of output current terminals 63, 64 of the second current divider 60 is coupled to the converter output 11 or the dummy output 12 by the number M of further switching arrangements 62, 101, 103 and the number (M−1) of further current dividers 100, 102. According to FIG. 4A, the number M is 3. The number M may also be 1, 2 or more than 3.

The cascade structure 40 comprises the number L of segmentation levels. In the example shown in FIG. 4A, the number L of segmentation levels is 5. A fourth segmentation level 104 of the number L of segmentation levels comprises the third current divider 100 and the fourth switching arrangement 101. A last segmentation level 105 of the number L of segmentation levels comprises the last current divider 102 and the last switching arrangement 103. The last segmentation level 105 may be named fifth segmentation level. The last current divider 102 may be named fourth current divider. The last switching arrangement 103 may be named fifth switching arrangement. The third current divider 100 may be thermometer-coded. The last current divider 102 may be thermometer-coded.

The cascade structure 40 couples the converter output 11 and the dummy output 12 to the voltage terminal 37. The converter output 11 and the dummy output 12 are coupled via the last segmentation level 105 to the fourth segmentation level 104. The fourth segmentation level 104 is coupled via the third segmentation level 71 to the second segmentation level 42. The second segmentation level 42 is coupled via the first segmentation level 41 to the voltage terminal 37.

As indicated by dots in FIG. 4A, there may be at least a further current divider and at least a further switching arrangement arranged between the fourth switching arrangement 101 and the last current divider 102. The further current dividers may be thermometer-coded. The number L of segmentation levels may be 6 or more. Each further segmentation level comprises a current divider and a switching arrangement.

The second, third and fourth switching arrangement 31, 62, 101 are realized such as the first switching arrangement 18. Thus, the number of changeover switches 32, 33, 67, 68, 110, 111 is exactly two in each of the switching arrangements 31, 62, 101. Each changeover switch 32, 33, 67, 68, 110, 111 may have the maximum of two outputs. Each changeover switch 32, 33, 67, 68, 110, 111 may have exactly two outputs.

The second, the third and the last current divider 60, 100, 102 are realized such as the first current divider 24. Thus, the number of output current terminals 63, 64, 115 to 118 of each current divider 24, 60, 100, 102 is exactly two. The second current divider 60 comprises a first and a second divider current source 120, 121 coupling the input current terminal 61 to the first and the second output current terminal 63, 64. The third current divider 100 comprises a first and a second divider current source 122, 123 coupling an input current terminal 126 to a first and a second output current terminal 115, 116. The last current divider 102 comprises a first and a second divider current source 124, 125 coupling an input current terminal 127 to a first and a second output current terminal 117, 118. The second, the third and the last current divider 60, 100, 102 each have a first and a second divider current source 120 to 125. The number of divider current sources 120 to 125 in each of the current dividers 24, 60, 100, 102 is exactly 2. These divider current sources 120 to 125 may be realized as shown in FIG. 3B.

The last switching arrangement 103 comprises a changeover switch 112 coupling the first output current terminal 117 of the last current divider 102 to the converter output 11 or the dummy output 12. The last switching arrangement 103 comprises a switch 113 coupling the second output current terminal 118 of the last current divider 102 to the dummy output 12. Advantageously, the first and the second divider current source 124, 125 of the last current divider 102 have an equal resistive load by the changeover switch 112 and the switch 113.

In FIG. 4A, the DA converter 10 is implemented as a fully binary cascode K+1 bit DA converter. The digital input signal DIN is realized as DAC digital input code. The digital input signal DIN is written as DIN(K:0), where DIN(K) is the most significant bit and DIN(0) is the least significant bit. Each bit of the digital input signal DIN determines the current flow in each segmentation level 41, 42, 71, 104, 105. A segmentation level can be named cascode level or cascode current level. In each cascode current level 41, 42, 71, 104, 105, a lower cascode current source is divided equally into two equal current sources to be selected by a bit of the digital input signal DIN.

In the following, bit by bit, the selection of each cascode current level is explained in detail according to FIG. 4A.

The first control signal DINC is equal to the bit DIN(K). The bit DIN(K) is the most significant bit. The first and the second current source 13, 14 are two equal most significant current sources. The first and the second current source 13, 14 provide a first and a second source current IC(1), IC(2) which can be named IS0(0) and IS0(1). The second source current IC(2) flows through the second current source 14. The first and the second source current IC(1), IC(2) have the same current value. If the bit DIN(K)=1, then the first source current IC(1) is selected into the output current IOUT and the second source current IC(2) is selected into the first current divider 24 to generate two equal divider currents IF(1), IF(2). The divider currents IF(1), IF(2) can be named sub-current sources IS1(0) and IS1(1). If the bit DIN(K)=0, then the first source current IC(1) is selected into the first current divider 24 to generate two equal divider currents IF(1), IF(2) and the second source current IC(2) is selected into the dummy current IDU.

The second control signal DINF is equal to the bit DIN(K−1). If the bit DIN(K−1)=1, then the divider current IF(1) (that is named IS1(0)) is selected into the output current IOUT and the divider current IF(2) (that is equal to IS1(1)) is selected into the second current divider 60 to generate two equal divider currents IL(1), IL(2). The divider currents IL(1), IL(2) can be named sub-current sources IS2(0) and IS2(1). If the bit DIN(K−1)=0, then the divider current IF(1) is selected into the second current divider 60 to generate two equal divider currents IL(1), IL(2) and the divider current IF(2) is selected into the dummy current IDU.

The third control signal DINL is equal to the bit DIN(K−2): If the bit DIN(K−2)=1, then the divider current IL(1) (that is called IS2(0)) is selected into the output current IOUT and the divider current IL(2) (that is equal IS2(1)) is selected into the third current divider 100 to generate two equal divider currents IR(1), IR(2). The divider currents IR(1), IR(2) may be named sub-current sources IS3(0) and IS3(1). If the bit DIN(K−2)=0, then the divider current IL(1) is selected into the third current divider 100 to generate two equal divider currents IR(1), IR(2) and the divider current IL(2) is selected into the dummy current IDU.

A fourth control signal DINR is equal to the bit DIN(K−3): If the bit DIN(K−3)=1, then the divider current IR(1) (that is IS3(0)) is selected into the output current IOUT and the divider current IR(2) (that is IS3(1)) is selected into the last current divider 102 to generate two equal divider currents IT(1), IT(2). The divider currents IT(1), IT(2) can be named sub-current sources IS4(0) and IS4(1). If the bit DIN(K−3)=0, then the divider current IR(1) is selected into the last current divider 102 to generate two equal divider currents IT(1), IT(2) and the divider current IR(2) is selected into the dummy current IDU.

This goes all way to the least significant bit DIN(0). A last control signal DINT is equal to the least significant bit. The last control signal DINT is equal to the bit DIN(0). The last control signal DINT may be named fifth control signal. The bit DIN(0) is the least significant bit. The current sources 117, 118 are two equal least significant current sources. They provide two equal divider currents IT(1), IT(2) (which can be named ISk(0) and ISk(1)). If the bit DIN(0)=1, then the divider current IT(1) (called ISk(0)) is selected into the output current IOUT and the divider current IT(2) (called ISk(1)) is selected into the dummy current IDU. If the bit DIN(0)=0, then both divider currents IT(1), IT(2) (called ISk(0) and ISk(1)) are both selected into the dummy current IDU.

Each switching arrangement 18, 31, 62, 101, 103 is controlled by exactly one bit of the digital input signal DIN. The number of bits of the digital input signal DIN is equal to the number of switching arrangements 18, 31, 62, 101, 103 of the DA converter 10. The first switching arrangement 18 is controlled by the most significant bit. The last switching arrangement 103 is controlled by the least significant bit. There is one switching arrangement 18, 31, 62, 101, 103 per bit of the digital input signal DIN. The DA converter 10 may be named cascoding binary DAC scheme.

Advantageously, there is a constant current flow through each current source 13, 14 and each divider current source 93, 94, 120 to 125. This constant current flow is independent of the value of the digital input signal DIN.

The output current IOUT is a linear function of the digital input signal DIN due to the switching of the switching arrangements 18, 31, 62, 101, 103 and not due an increase or decrease of a current flowing through one of the current sources 13, 14 or one of the divider current sources 93, 94, 120 to 125.

In an alternative, not shown embodiment, the switch 113 of the last switching arrangement 103 is replaced by a connection line.

In an alternative, not shown embodiment, the switch 113 of the last switching arrangement 103 is implemented as a changeover switch coupling the second output current terminal 118 of the last current divider 102 that is the fourth current divider to the dummy output 12 or to the converter output 11.

In an alternative, not shown embodiment, the number L of segmentation levels may be less than 5 such as 2, 3 or 4. The last switching arrangement may be realized such as the last switching arrangement 103 (which is the fifth switching arrangement) in FIG. 4A. In case of the number L being 2, the second switching arrangement 31 shown in FIGS. 1B and 1C may be configured such as the last switching arrangement 103 in FIG. 4A. In case of the number L being 3, the third switching arrangement 62 shown in FIG. 1D may be configured such as the last switching arrangement 103 in FIG. 4A.

FIG. 4B shows a further exemplary embodiment of the DA converter 10 which is a further development of the embodiments shown above. The first changeover switch 19 of the first switching arrangement 18 comprise one input and three outputs. A first output it connected to the converter output 11, a second output is connected to the first current divider 24 and a third output is connected to the dummy output 12. The second changeover switch 20 of the first switching arrangement 18 is realized as the first changeover switch 19 of the first switching arrangement 18.

The changeover switches 32, 33, 67, 68, 110, 111 of the second, third and fourth switching arrangement 31, 62, 101 are realized such as the changeover switches 19, 20 of the first switching arrangement 18.

The last switching arrangement 103 comprises two changeover switches 112, 113 which both may have one input and two outputs. A first output is connected to the converter output 11 and a second output is connected to the dummy output 12. In FIG. 4B, the last switching arrangement 103 is the fifth switching arrangement.

One bit of the digital input signal DIN determines the current flow in one segmentation level 41, 42, 71, 104, 105.

The invention claimed is:

1. A digital-to-analog converter, comprising
    a converter output,
    a dummy output,
    a first number N of current sources,
    a first switching arrangement,
    a first current divider with a second number K of output current terminals,
    a second switching arrangement, and
    a second current divider with a third number P of output current terminals,
    wherein each of the first number N of current sources is coupled via the first switching arrangement either to the converter output, the dummy output or to an input current terminal of the first current divider,
    wherein each of the second number K of output current terminals of the first current divider is coupled via the second switching arrangement either to the converter output, the dummy output or to an input current terminal of the second current divider,
    wherein each of the third number P of output current terminals of the second current divider is coupled to the converter output or the dummy output, and
    wherein at least one of the first number N of current sources, the second number K of output current terminals or the third number P of output current terminals is exactly two.

2. The digital-to-analog converter according to claim 1, wherein the digital-to-analog converter comprises at least one further current divider and at least one further switching arrangement and
    wherein each of the second number K of output current terminals of the first current divider is coupled via the second switching arrangement either to the converter output, the dummy output or via the at least one further current divider and the at least one further switching arrangement to the input current terminal of the second current divider.

3. The digital-to-analog converter according to claim 1, wherein each of the third number P of output current terminals of the second current divider is coupled to the converter output or the dummy output by a number M of further switching arrangements and a number (M−1) of further current dividers, wherein the number M is larger than 0.

4. The digital-to-analog converter according to claim 1, wherein the first number N of current sources are realized as a current mirror.

5. The digital-to-analog converter according to claim 1, wherein the first number N of current sources are thermometer-coded.

6. The digital-to-analog converter according to claim 1, wherein the first current divider is thermometer-coded.

7. The digital-to-analog converter according to claim 1, wherein the first current divider comprises a second number K of divider transistors,
    wherein the input current terminal of the first current divider is coupled to first terminals of the second number K of divider transistors and
    wherein the second number K of output current terminals of the first current divider are coupled to second terminals of the second number K of divider transistors.

8. The digital-to-analog converter according to claim 7, wherein the second number K of divider transistors have an equal current driving capability.

9. The digital-to-analog converter according to claim 1, wherein the digital-to-analog converter is configured such that an output current flowing through the converter output is proportional to a digital input signal provided to the digital-to-analog converter.

10. The digital-to-analog converter according to claim 1, wherein the first number N of current sources is at least two, the second number K of output current terminals is at least two and the third number P of output current terminals is at least two.

11. A method for digital-to-analog conversion,
    wherein at least a portion of a first source current that flows through a first current source of a first number N of current sources flows to a converter output,
    wherein each of the first number N of current sources is coupled via a first switching arrangement either to the converter output, a dummy output or to an input current terminal of a first current divider,
    wherein each of a second number K of output current terminals of the first current divider is coupled via a second switching arrangement either to the converter output, the dummy output or to an input current terminal of a second current divider,
    wherein each of a third number P of output current terminals of the second current divider is coupled to the converter output and/or the dummy output, and
    wherein at least one of the first number N of current sources, the second number K of output current terminals or the third number P of output current terminals is exactly two.

12. The method for digital-to-analog conversion according to claim 11,
    wherein each of the second number K of output current terminals of the first current divider is coupled via the second switching arrangement either to the converter output, the dummy output or via at least one further current divider and at least one further switching arrangement to the input current terminal of the second current divider.

13. The method for digital-to-analog conversion according to claim 11,
    wherein an output current flowing through the converter output is proportional to a digital input signal provided to a digital-to-analog converter.

14. A digital-to-analog converter, comprising
    a converter output and
    a cascade structure that is coupled to the converter output and comprises a number L of segmentation levels,
    wherein a first segmentation level of the number L of segmentation levels comprises a first number N of current sources and a first switching arrangement,
    wherein a second segmentation level of the number L of segmentation levels comprises a first current divider with an input current terminal and a second number K of output current terminals and a second switching arrangement,
    wherein a third segmentation level comprises a second current divider and a third switching arrangement, and
    wherein the first number N of current sources is exactly 2, the second number K of output current terminals of the first current divider is exactly 2 and a third number P of output current terminals of the second current divider is exactly 2.

15. A digital-to-analog converter, comprising
a converter output,
a dummy output,
a first number N of current sources,
a first switching arrangement,
a first current divider with a second number K of output current terminals,
a second switching arrangement,
a second current divider with a third number P of output current terminals, and
a third switching arrangement,
wherein each of the first number N of current sources is coupled via the first switching arrangement either to the converter output, the dummy output or to an input current terminal of the first current divider,
wherein each of the second number K of output current terminals of the first current divider is coupled via the second switching arrangement either to the converter output, the dummy output or to an input current terminal of the second current divider,
wherein each of the third number P of output current terminals of the second current divider is coupled to the converter output or the dummy output via the third switching arrangement, and
wherein a last of the third number P of output current terminals of the second current divider is permanently connected to the dummy output.

* * * * *